United States Patent [19]

Inomata et al.

[11] Patent Number: 5,636,105
[45] Date of Patent: Jun. 3, 1997

[54] ELECTRONIC EQUIPMENT DEVICE HAVING CLAMPS

[75] Inventors: Youji Inomata, Yokohama; Yasunobu Ikeda, Tokyo; Michiyoshi Kudoh; Kanta Judai, both of Yokohama, all of Japan

[73] Assignee: Matsushita Electric Industrial Co., Ltd., Osaka, Japan

[21] Appl. No.: 503,488

[22] Filed: Jul. 18, 1995

[30] Foreign Application Priority Data

Jul. 29, 1994 [JP] Japan .................................. 6-178037

[51] Int. Cl.⁶ ...................................................... H05K 9/00
[52] U.S. Cl. ........................... 361/816; 361/818; 361/799; 361/814; 361/825; 174/35 K
[58] Field of Search .............................. 361/790, 796, 361/799, 800, 816, 818, 814, 803, 804, 737, 825, 829; 174/35 R, 51; 364/708.1; 379/58, 59; 455/90, 89, 95, 91, 300; 235/472

[56] References Cited

U.S. PATENT DOCUMENTS 4,791,527 12/1988 Brown ...................................... 361/818
5,513,996 5/1996 Annerino et al. ........................ 439/95
5,557,507 9/1996 Koike et al. ............................. 361/818

*Primary Examiner*—Leo P. Picard
*Assistant Examiner*—Anthony Dinkins
*Attorney, Agent, or Firm*—Watson Cole Stevens Davis, P.L.L.C.

[57] ABSTRACT

There is disclosed an electronic equipment device. A pair of first and second printed boards are superposed with an electrically-conductive shield frame interposed therebetween in such a manner that those faces of the two printed boards having associated electronic parts mounted thereon are faced to each other. The shield frame has an integral peripheral wall extending over an entire peripheral edge thereof. This peripheral wall surrounds the electronic parts mounted on each of the two printed boards to achieve a shielding effect. Right and left sides of the stack of the two printed boards and the shield frame interposed therebetween are clamped respectively by a pair of resilient clamping members of a U-shaped cross-section to thereby provide a unitary assembly. These resilient clamping members cause earth portions of the first and second printed boards to be electrically connected to the shield frame. Finally, the above stack is housed in a casing body, thus completing the assembling of the electronic equipment device.

12 Claims, 8 Drawing Sheets

ELECTRONIC EQUIPMENT DEVICE HAVING CLAMPS

BACKGROUND OF THE INVENTION

This invention relates to an electronic equipment device such as a small portable radiophone.

Referring to FIG. 8 which shows the construction of a conventional electronic equipment device of the type described, this electronic equipment device comprises a casing body 101, an antenna 102, a speaker (transmitter) 103, dial buttons 104 arranged in a 3×4 arrangement, and function buttons 105 for controlling various functions. Various electronic parts are mounted on a printed board 106, and an indicator such as an LED is mounted on one face of the printed board 106. A radio transceiver portion 108 is covered with a shield case. A casing cover 109 is provided with a receiver 110. A battery pack 111 is attached to the casing cover 110. The radio transceiver portion 108 is secured to the printed board 106, and then the printed board 10 is housed in the casing body 101, and then the casing cover 110 is put on the casing body 101. Finally, the casing cover 110 and the casing body 101 are fastened together by screws 112.

In the above conventional electronic equipment device, however, a shield construction, which effects the shielding of the radio transmitter portion 108 and the shielding of electronic circuitry (which includes those circuits constituting a speaking portion and a control portion) on the printed board 106 independently of each other, is complicated, and can be easily affected by a mechanical impact. Another problem is that the number of the component parts, as well as time and labor required for assembling the electronic equipment device, are large since the assembling should be carried out by screwing.

SUMMARY OF THE INVENTION

In view of the above-mentioned problems, it is an object of this invention to provide an electronic equipment device in which a radio transceiver and electronic circuits are shielded independently of each other by a simple construction, and the device has a rigid structure, and can be assembled easily.

According to the present invention, there is provided an electronic equipment device comprising:

a first printed board having electronic parts mounted thereon;

a second printed board having electronic parts mounted thereon;

an electrically-conductive frame interposed between the first and second printed boards to sealingly accommodate the electronic parts, mounted on the first and second printed boards, to shield the electronic parts; and a resilient clamping member for clamping the two printed boards so as press them against the frame to electrically connect the two printed boards to the frame.

In the present invention, a radio transceiver portion is mounted on the first printed board, and a control circuit portion is mounted on the second printed board, and the frame is interposed between the first and second printed boards, with the electronic parts thereon facing the frame, to thereby provide a semi-assembly in which the two resilient clamping members grasp or clamp opposite side portions of this semi-assembly, respectively, to form an earth connection, so that the radio transceiver portion and the control circuit portion are shielded with the simple construction. Since the assembling is effected by the use of the resilient clamping members, the resultant assembly is mechanically rigid, and will not be twisted or deformed, and further, the number of the component parts, as well as time and labor required for assembling and disassembling the electronic equipment device, can be reduced.

DESCRIPTION OF THE PREFERRED EMBODIMENT

Figure 1:
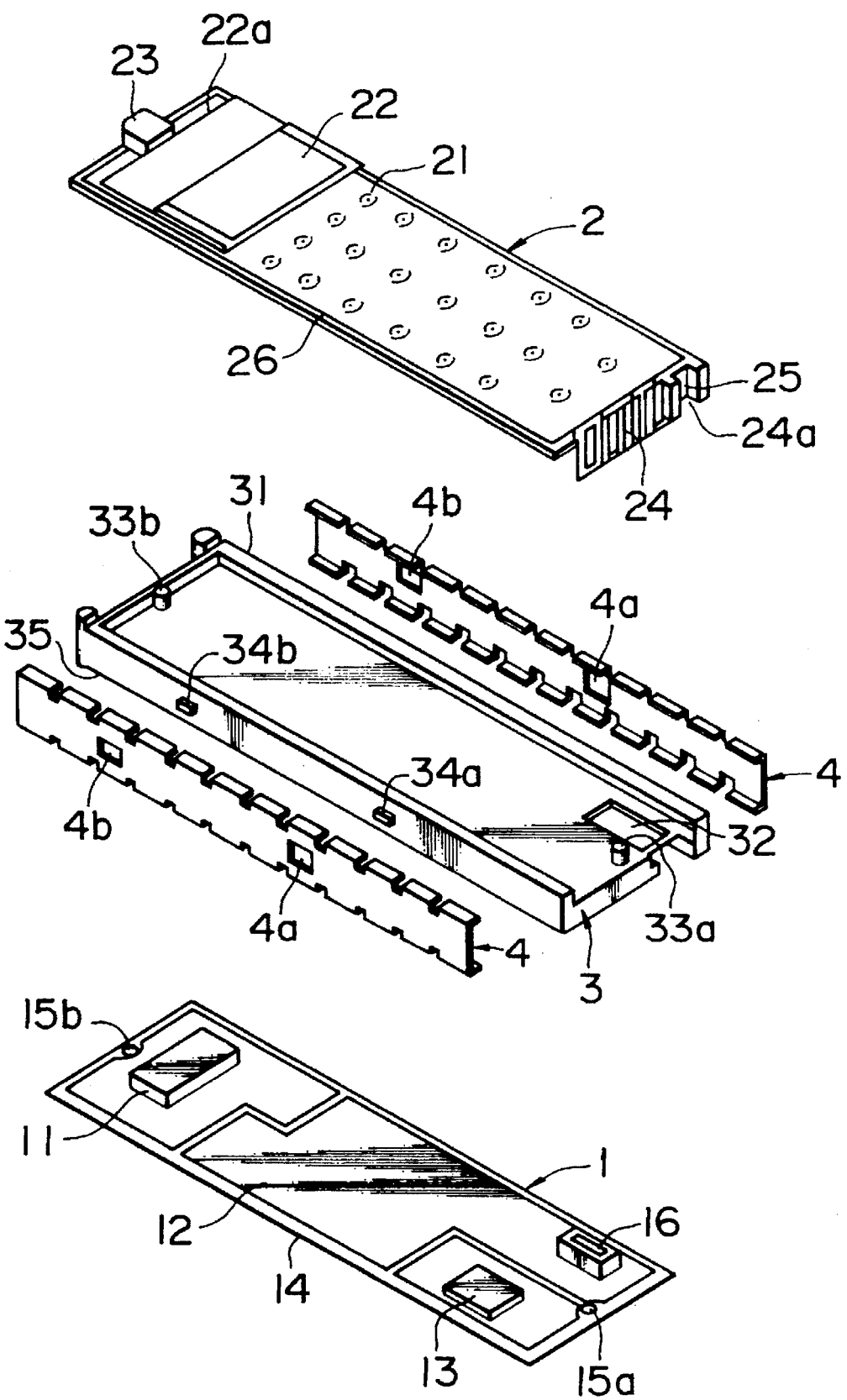
FIG. 1 is an exploded, perspective view of an important portion of a structure of an electronic equipment according to the present invention.
Figure 2:
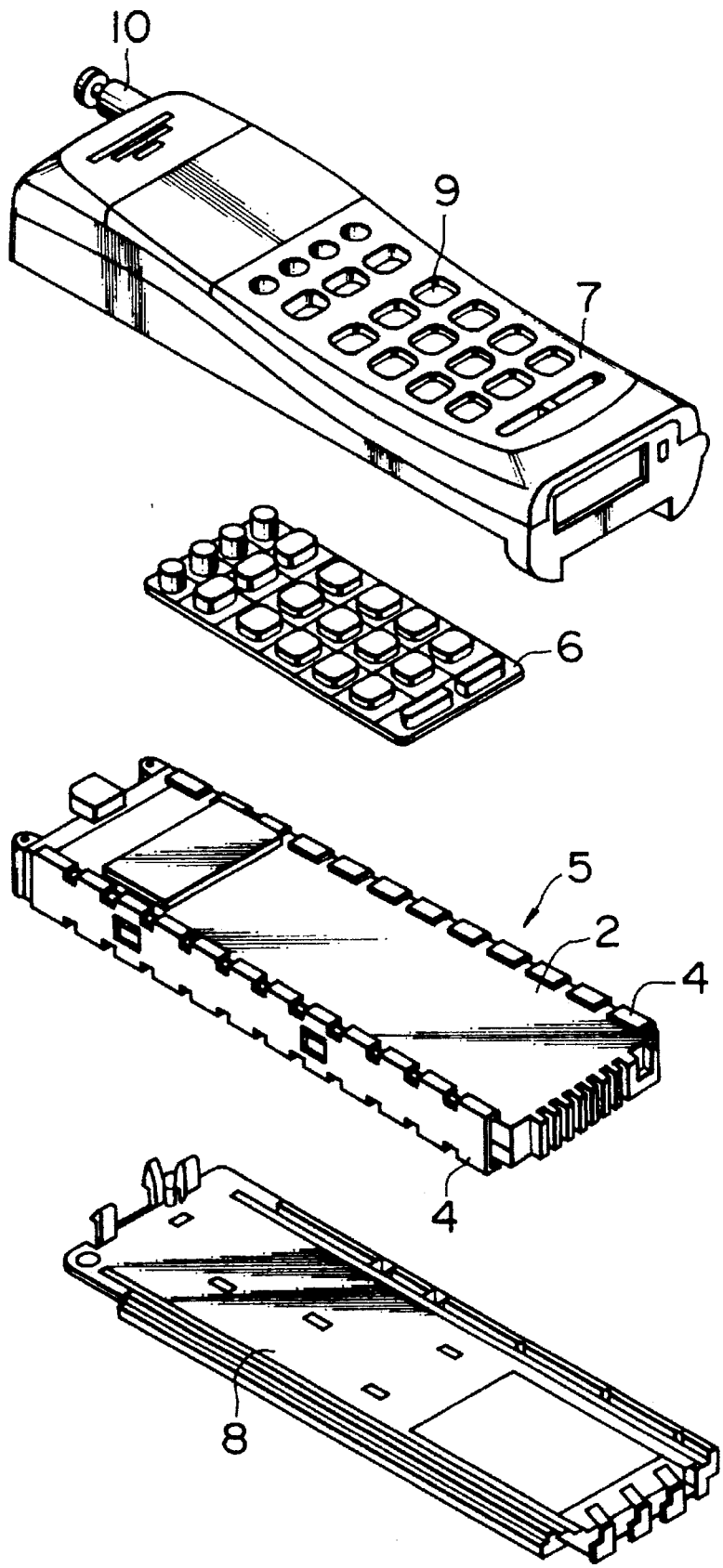
FIG. 2 is an exploded, perspective view illustrating the whole of the structural portion of the above device.

FIG. 1 is an exploded, perspective view which shows an important portion of a structural portion of an electronic equipment device provided in accordance with the present invention. In FIG. 1, reference numeral 1 denotes a first printed board, reference numeral 2 a second printed board, reference numeral 3 a metal frame of a generally H-shaped cross-section, and reference numeral 4 a pair of resilient clamping members. FIG. 2 is an exploded, perspective view of the whole of the structural portion of the electronic equipment device. In FIG. 2, reference numeral 5 denotes a printed board assembly formed by combining the members of FIG. 1 together, reference numeral 6 a dial button sheet, reference numeral 7 a casing body, and reference numeral 8 a casing cover. Button holes 9 for respectively exposing the above buttons are formed through a front wall of the casing body 7. An antenna 10 is mounted at one end of the casing body 7.

In FIG. 1, electronic parts, such as a radio transmitter portion 11, a radio receiver portion 12 and a frequency synthesizer 13, are mounted on a front face of the first printed board 1. A strip-like earth portion 14 (indicated by hatching) for electrical connection to the metal frame 3 is formed on a peripheral edge portion of the printed board 1, and is also formed on the front face of the first printed board 1 and along borders around the electronic parts mounted thereon. A registration hole 15a of a circular shape is formed in a lower end portion of the first printed board 1 while a registration hole 15b of an oval shape is formed in an upper end portion thereof. Reference numeral 16 denotes a connector.

Figure 3:
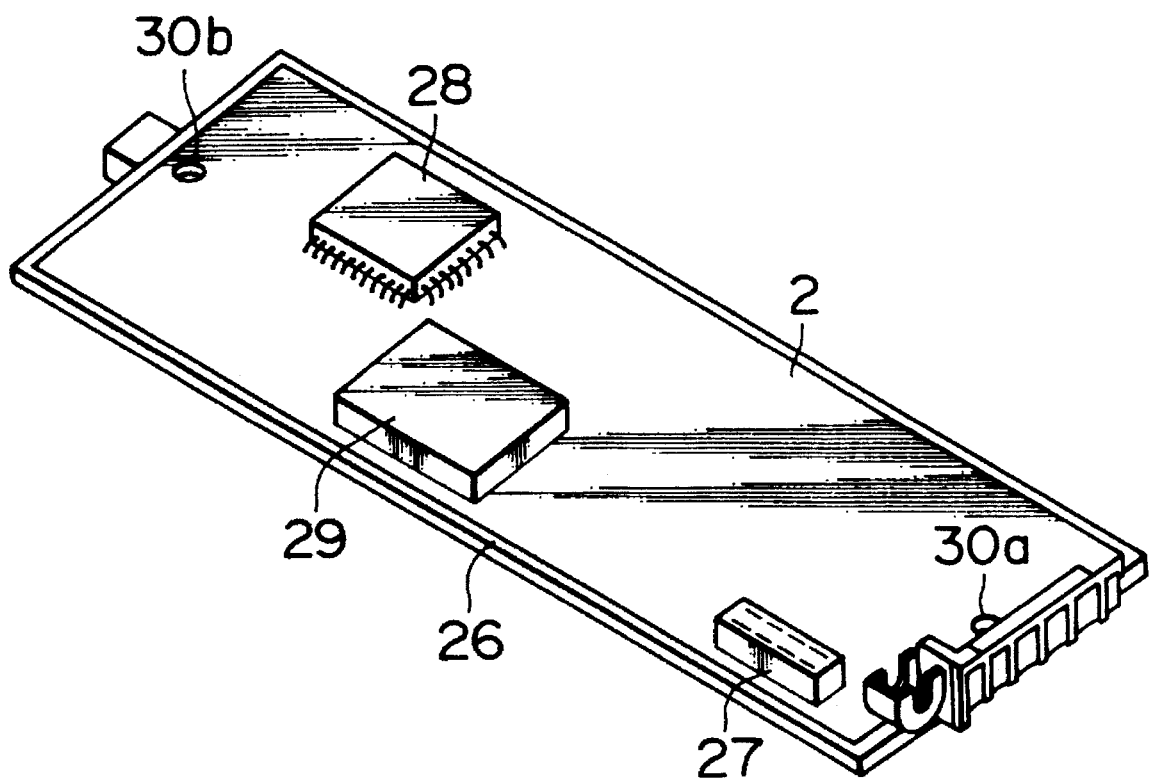
FIG. 3 is a perspective view showing a back side of a second printed board in the above device.

A plurality of dial button contacts 21 are formed on a front face of the second printed board 2. A liquid crystal display (LCD) 22 is secured by soldering to the second printed board 2 through a contact portion 22a. A calling buzzer 23 and an external connection terminal 24 are also secured by soldering to the second printed board 2. A microphone unit 25 is secured by soldering to the second printed board 2 within a U-shaped groove portion 24a formed in a mold portion of the external connection terminal 24. A strip-like earth portion 26 (indicated by hatching) is formed on each of the front and back faces of the second printed board 2 at a peripheral edge portion thereof. FIG. 3 shows the back face of the second printed board 2 having the earth portion 26 formed thereon. A connection connector 27, a microcomputer 28 and an IC 29 are secured by soldering to the back face of the second printed board 2. The second printed board 2 has a registration hole 30a of a circular shape and a registration hole 30b of an oval shape.

Figure 4:
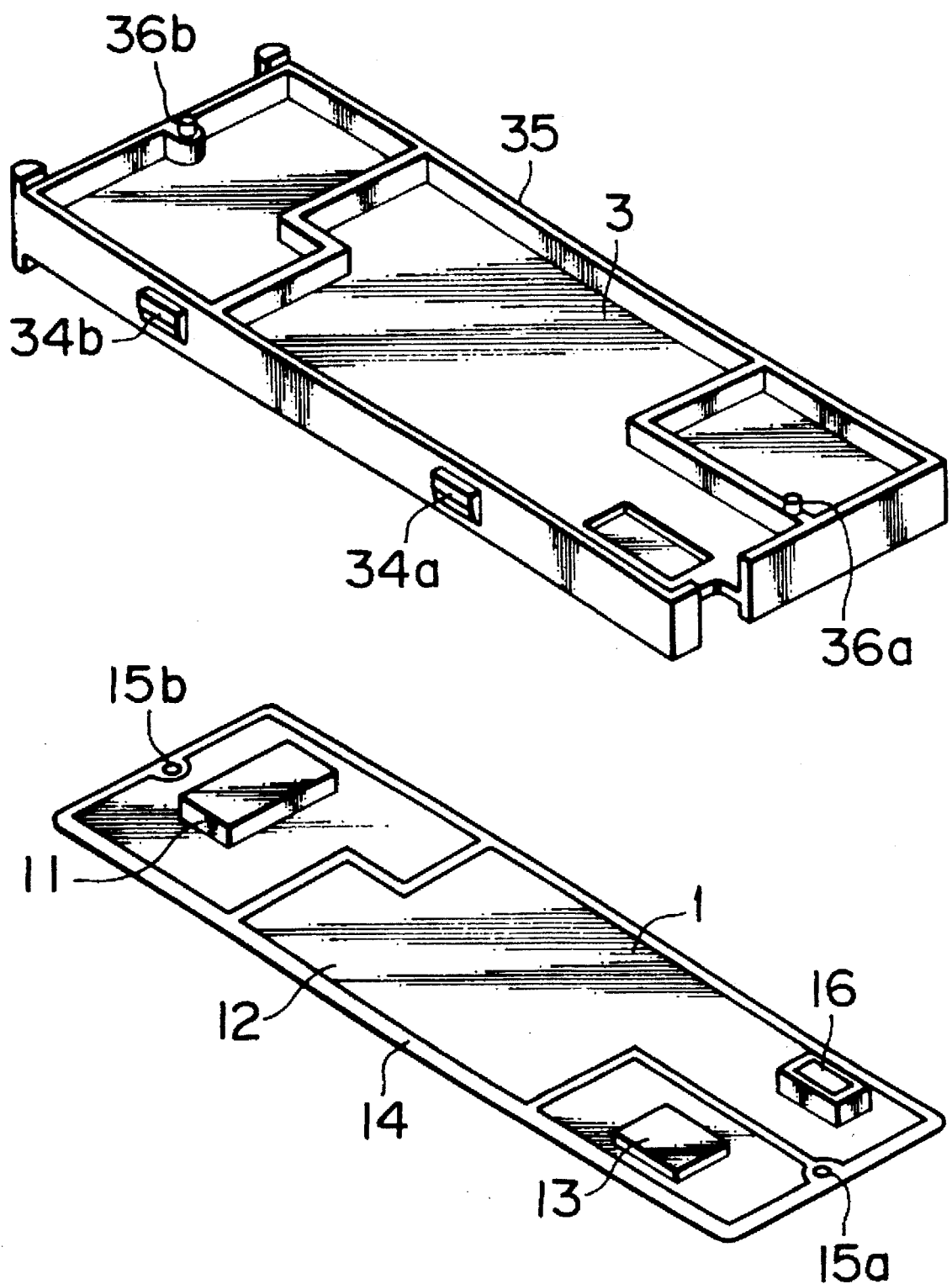
FIG. 4 is a perspective view showing a front side of a first printed board and a back side of a metal frame in the above device.

In FIG. 1, the metal frame 3 is diecast of magnesium, and has an outer shape similar to that of the first and second printed board 1 and 2. The metal frame 3 has a projected wall portion 31 formed on the outer peripheral edge portion thereof, so that this metal frame 3 has a H-shaped cross-section. A loose hole 32 is formed through the metal frame 3, and the connector 16 on the first printed board 1 and the connector 27 on the second printed board 2 are connected together through this loose hole 32. A pair of registration projections 33a and 33b are formed on a front face of the metal frame 3, and are adapted to be fitted respectively in the registration holes 30a and 30b in the second printed board 2. Retaining projections 34a and 34b are formed on each of the opposite side walls of the metal frame 3, and are adapted to be engaged respectively in retaining recesses (described later) in the casing body 7. As shown in FIG. 4, a projected wall portion 35 is formed on the outer peripheral edge portion of the back face of the metal frame 3, and has the same configuration as that of the earth portion 14 on the first printed board 1 so that the wall portion 35 can make contact with only this earth portion 14. Registration projections 36a and 36b are formed respectively on lower and upper end portions of the back face of the metal frame 3, and are adapted to be fitted respectively in the registration holes 15a and 15b in the first printed board 1.

As clearly shown in FIG. 1, each of the two resilient clamping members 4 is formed by bending a thin stainless steel sheet into a U-like cross-sectional shape, and a number of slits or notches are formed in each of opposite sides thereof. The resilient clamping member 4 is slightly curved inwardly in its entirety so to increase a clamping force. A pair of guide holes 4a and 4b are formed through each resilient clamping member 4 in registry with the two retaining projections 34a and 34b formed on the corresponding side wall of the metal frame 3.

Figure 5A:
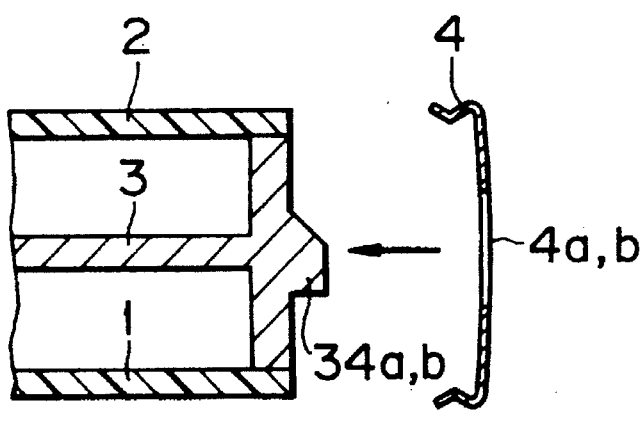
FIGS. 5a and 5b are fragmentary, cross-sectional views showing an assembling construction of a printed board assembly in the above device.
Figure 5B:
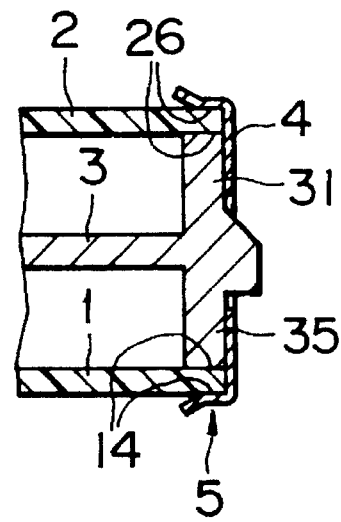

The assembling of the electronic equipment device of this embodiment will now be described. In FIGS. 1, 3 and 4, the registration holes 15a and 15b in the first printed board 1 are fitted respectively on the registration projections 36a and 36b on the back face of the metal frame 3, and the registration holes 30a and 30b in the second printed board 2 are fitted respectively on the registration projections 33a and 33b on the front face of the metal frame 3. Thus, the second printed board 2 is superposed on the first printed board 1 through the metal frame 3. Then, in this condition, as shown in FIG. 5a, the two resilient clamping members 4 are pressed against the opposite sides of this semi-assembly, respectively, so that the guide holes 4a and 4b in each resilient clamping member 4 are fitted respectively on the associated retaining projections 34a and 34b on the metal frame 3. The opposite side portions of each resilient clamping member 4 are bent inwardly into a generally V-shaped, and further, the resilient clamping member 4 is curved slightly inwardly in its entirely. Therefore, each resilient clamping member 4 can be easily pressed onto the first and second printed boards 1 and 2 between which the metal frame 3 is interposed so as to clam the same, and the two resilient clamping members 4 can firmly join or connect the first and second printed board 1 and 2 and the metal frame 3 together. As a result, the printed board assembly 5 is assembled as shown in FIG. 5b. In this condition, the edge surface of the earth portion 14 of the first printed board 1 is held in contact with the edge surface of the wall portion 35 of the metal frame 3, and the edge surface of the earth portion 26 of the second printed board 2 is held in contact with the edge surface of the wall portion 31 of the metal frame 3. As a result, that side of the first printed board 1 having the electronic parts mounted thereon is closed or sealed by the back face of the metal frame 3 and the wall portion 35, and also that side of the second printed board 2 having the electronic parts mounted thereon is closed or sealed by the front face of the metal frame 3 and the wall portion 31. Therefore, these electronic parts can be easily shielded with the simple construction.

Figure 6A:
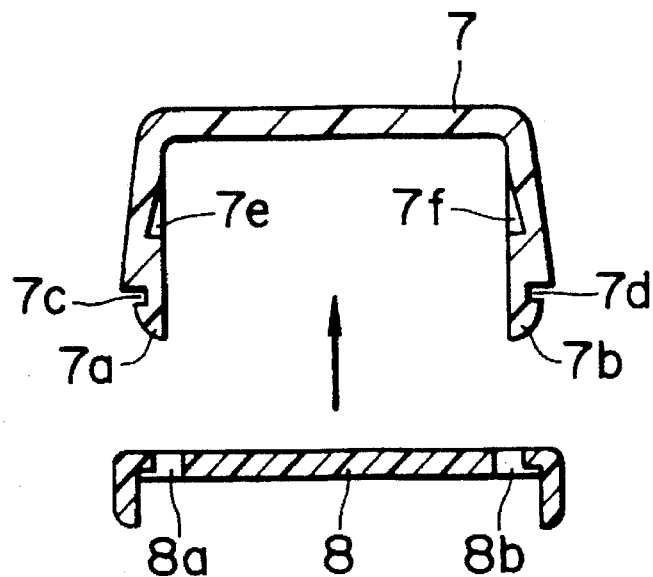
FIGS. 6a and 6b are fragmentary, cross-sectional views showing an assembling construction of a casing body and a casing cover in the above device.
Figure 6B:
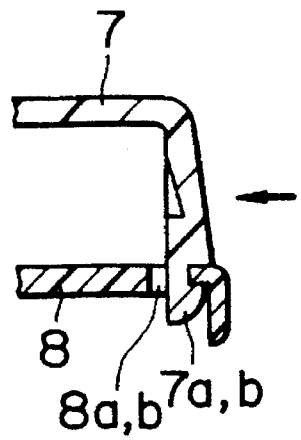
Figure 6C:
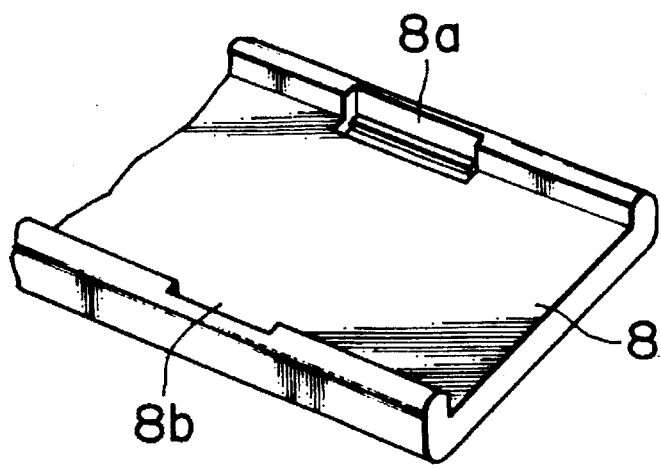
FIG. 6c is a fragmentary, perspective view showing retaining holes in the casing cover.
Figure 7:
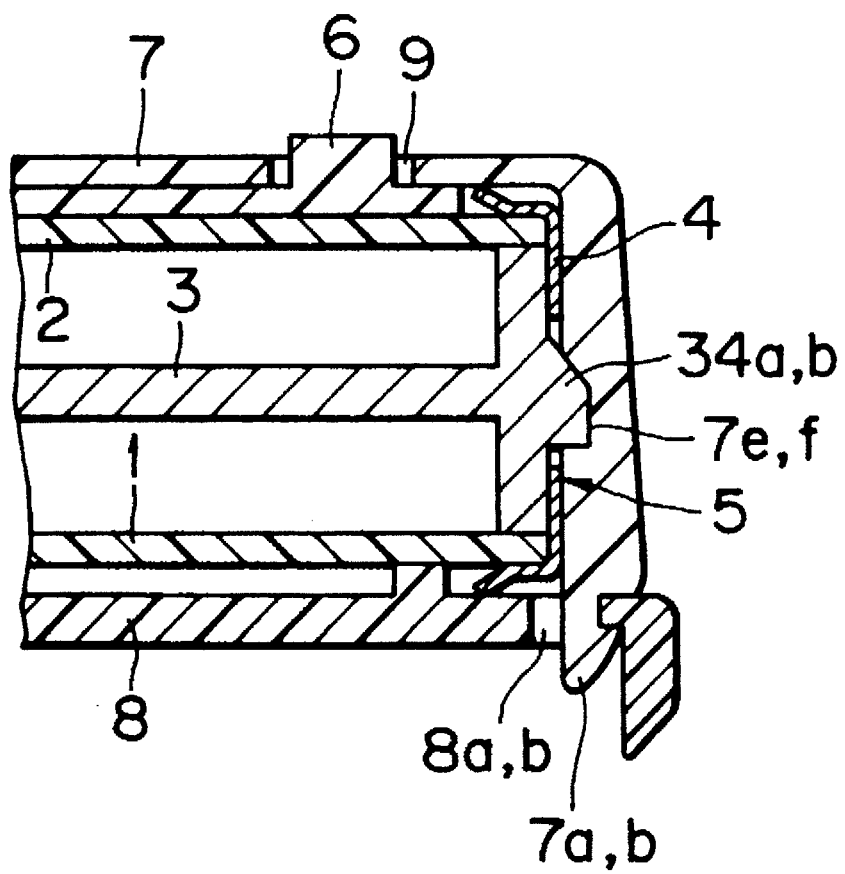
FIG. 7 is a fragmentary, cross-sectional view showing an assembling construction of the above device.
Figure 8:
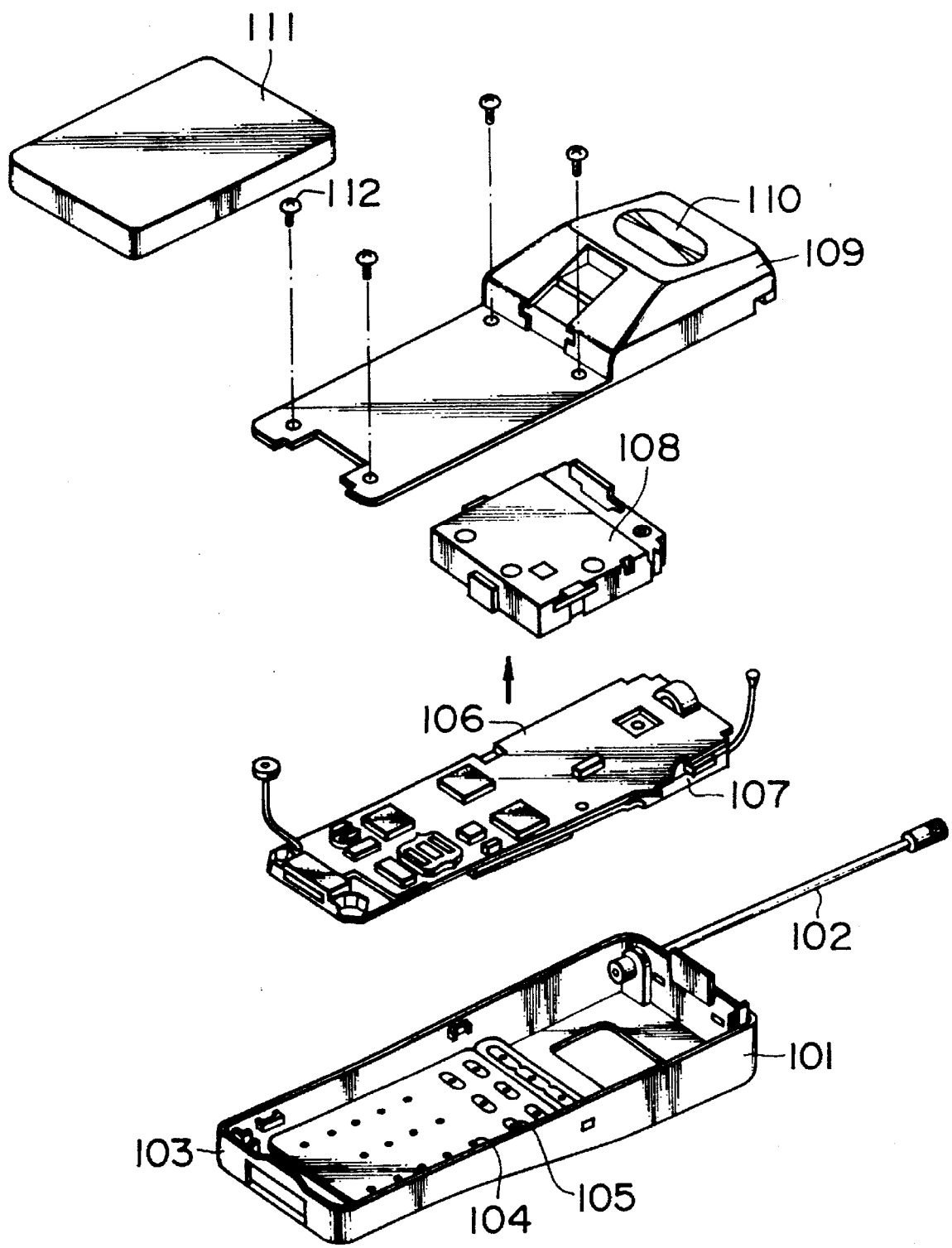
FIG. 8 is an exploded, perspective view of a conventional electronic equipment device.

Next, the connection of the casing cover 8 to the casing body 7 will now be described. As shown in FIG. 6a, the casing body 7 has a U-like cross-sectional shape, and a plurality of retaining pawls 7a, 7b are formed integrally on the edge of each of opposite side walls thereof, and are spaced from one another along this side wall. On the other hand, retaining holes 8a and 8b are formed in those portions facing respectively to the retaining pawls 7a and 7b, as shown in FIG. 6c. With this arrangement, when the retaining pawls 7a and 7b on the casing body 7 are forced into the respective retaining holes 8a and 8b in the casing cover 8, a slanting surface of each retaining pawl 7a, 7b is pressed against an edge of the associated retaining hole 8a, 8b, so that the retaining pawl 7a, 7b are flexed inwardly, and then when recesses 7c, 7d immediately adjacent to the retaining pawl 7a, 7b are brought into the retaining holes 8a, 8b, the retaining pawls 7a, 7b are elastically restored to be locked in the associated retaining holes 8a, 8b, so that the casing body 7 and the casing cover 8 are easily connected together. For disconnecting the casing body 7 and the casing cover 8 from each other, the casing body 7 is pulled away from the casing cover 8 while pressing the opposite side walls of the casing body 7 toward each other (see FIG. 6b), so that the casing body 7 can be easily disconnected from the casing cover 8. Reference numerals 7e and 7f denote the retaining recesses for holding the printed board assembly.

Therefore, the printed board assembly 5 assembled in the manner shown in FIG. 5 is placed on the casing cover 8, and the dial button sheet 6 is placed on the printed board assembly 5. Next, the casing body 7 is put on the casing cover 8 to cover the printed board assembly 5 and the dial button sheet 6, and is pressed against the casing cover 8 so that the retaining pawls 7a and 7b are forced into the respective retaining holes 8a and 8b, and also the retaining projections 34a and 34b on the metal frame 3 are engaged in the respective retaining recesses 7e and 7f in the casing body 7 thereby to firmly hold the printed board assembly 5. Thus, the entire electronic equipment device can be easily assembled without the use of any screw.

As described above, the electronic equipment device comprises the first and second printed boards each having the associated electronic parts mounted thereon, the electrically-conductive frame interposed between the first and second printed boards to sealingly accommodate the electronic parts, mounted on the two printed boards so as to shield the electronic parts, and the resilient clamping members pressing the two printed boards against the frame to electrically connect the two printed boards to the frame. The radio transceiver portion is mounted on the first printed board, and the control circuit portion is mounted on the second printed board, and the frame is interposed between the first and second printed boards with these electronic parts facing the frame, thereby to provide the semi-assembly, and the two resilient clamping members grasp or clamp opposite side portions of this semi-assembly, respectively, to form the earth connection, so that the radio transceiver portion and the control circuit portion are shielded with the simple construction. Since the assembling is effected by the use of the resilient clamping members, the resultant assembly is mechanically rigid, and will not be twisted or deformed, and further, the number of the component parts, as well as time and labor required for assembling and disassembling the electronic equipment device, can be reduced.

What is claimed is:

1. An electronic equipment device comprising:

a first printed board having electronic parts mounted thereon;

a second printed board having electronic parts mounted thereon;

an electrically-conductive frame interposed between said first and second printed boards to sealingly accommodate said electronic parts, mounted on said first and second printed boards, to shield said electronic parts; and a resilient clamping means pressing said two printed boards against said frame to electrically connect said two printed boards to said frame.

2. An electronic equipment device according to claim 1, in which each of said two printed boards has a strip-like earth portion formed on each of opposite faces thereof at least at a peripheral edge portion thereof, said frame having a projected wall portion formed on each of opposite faces thereof at a peripheral edge portion thereof.

3. An electronic equipment device according to claim 2, wherein a radio transceiver portion is mounted on that face of said first printed board held in contact with said frame, whereas a control circuit portion is mounted on that face of said second printed board held in contact with said frame.

4. An electronic equipment device according to claim 1, wherein said resilient clamping means comprises a pair of electrically-conductive plates of a U-like cross-sectional shape, for resiliently grasp opposite side portions of said two printed boards between which said frame is interposed.

5. An electronic equipment device according to claim 4, in which there is provided a casing body; each of said two resilient clamping plates has guide holes; and said frame has projections formed on opposite side walls thereof, said projections being releasably engaged with said casing body through the respective guide holes.

6. An electronic equipment device according to claim 5, in which there is provided a casing cover connected to said casing body; said casing cover has retaining holes; and said casing body has retaining pawls releasably locked in said retaining holes, respectively.

7. An electronic equipment device according to claim 2, wherein said resilient clamping means comprises a pair of electrically-conductive plates of a U-like cross-sectional shape, for resiliently grasp opposite side portions of said two printed boards between which said frame is interposed.

8. An electronic equipment device according to claim 3, wherein said resilient clamping means comprises a pair of electrically-conductive plates of a U-like cross-sectional shape, for resiliently grasp opposite side portions of said two printed boards between which said frame is interposed.

9. An electronic equipment device according to claim 7, in which there is provided a casing body; each of said two resilient clamping plates has guide holes; and said frame has projection formed on opposite side walls thereof, said projections being releasably engaged with said casing body through the respective guide holds.

10. An electronic equipment device according to claim 8, in which there is provided a casing body; each of said two resilient clamping plates has guide holes; and said frame has projection formed on opposite side walls thereof, said projections being releasably engaged with said casing body through the respective guide holds.

11. An electronic equipment device according to claim 9, in which there is provided a casing cover connected to said casing body; said casing cover has retaining holes; and said casing body has retaining pawls releasably locked in said retaining holes, respectively.

12. An electronic equipment device according to claim 10, in which there is provided a casing cover connected to said casing body; said casing cover has retaining holes; and said casing body has retaining pawls releasably locked in said retaining holes, respectively.

* * * * *